United States Patent
Qu et al.

(10) Patent No.: US 11,314,132 B2
(45) Date of Patent: Apr. 26, 2022

(54) ARRAY SUBSTRATE AND DISPLAY PANEL

(71) Applicant: TCL China Star Optoelectronics Technology Co., Ltd., Shenzhen (CN)

(72) Inventors: Kaili Qu, Shenzhen (CN); Yoonsung Um, Shenzhen (CN)

(73) Assignee: TCL China Star Optoelectrenics Technology Co., Ltd., Shenzhen (CN)

( * ) Notice: Subject to any disclaimer, the term of this patent is extended or adjusted under 35 U.S.C. 154(b) by 261 days.

(21) Appl. No.: 16/627,337

(22) PCT Filed: Dec. 23, 2019

(86) PCT No.: PCT/CN2019/127341
§ 371 (c)(1),
(2) Date: Dec. 30, 2019

(87) PCT Pub. No.: WO2021/114382
PCT Pub. Date: Jun. 17, 2021

(65) Prior Publication Data
US 2021/0405466 A1 Dec. 30, 2021

(30) Foreign Application Priority Data

Dec. 11, 2019 (CN) .......................... 201911266596.9

(51) Int. Cl.
*G02F 1/1343* (2006.01)
*G02F 1/1337* (2006.01)
*G02F 1/1368* (2006.01)
*H01L 27/12* (2006.01)

(52) U.S. Cl.
CPC ...... *G02F 1/134345* (2021.01); *G02F 1/1368* (2013.01); *G02F 1/133746* (2021.01); *H01L 27/1214* (2013.01)

(58) Field of Classification Search
CPC ......... G02F 1/134345; G02F 1/133746; G02F 1/1368; H01L 27/1214
USPC ................................. 349/128–129, 141–147
See application file for complete search history.

(56) References Cited

U.S. PATENT DOCUMENTS

2013/0003004 A1* 1/2013 Shimizu .................. G02F 1/139
349/130
2016/0216585 A1* 7/2016 Park .................. G02F 1/133707

* cited by examiner

*Primary Examiner* — Charles S Chang

(57) ABSTRACT

An array substrate and a display panel are provided. The array substrate includes a substrate, a thin film transistor layer disposed on the substrate, and a pixel electrode layer disposed on the thin film transistor layer. The pixel electrode layer includes a plurality of pixel regions, and the pixel regions include a first pixel region and a second pixel region. A pixel electrode in the second pixel region is disposed along an outer boundary of the first pixel region, or a pixel electrode in the first pixel region is disposed along an outer boundary of the second pixel region.

18 Claims, 8 Drawing Sheets

ARRAY SUBSTRATE AND DISPLAY PANEL

RELATED APPLICATIONS

This application is a National Phase of PCT Patent Application No. PCT/CN2019/127341 having International filing date of Dec. 23, 2019, which claims the benefit of priority of Chinese Patent Application No. 201911266596.9 filed on Dec. 11, 2019. The contents of the above applications are all incorporated by reference as if fully set forth herein in their entirety.

FIELD AND BACKGROUND OF THE INVENTION

The present disclosure relates to the field of display technologies, and more particularly to an array substrate and a display panel.

With the improvement of living standards, liquid crystal displays (LCDs) are increasingly sought after by people.

In the prior art, a main pixel region and a sub-pixel region in a display pixel electrode layer domain of a liquid crystal display are arranged up and down in this order. Voltages of the main pixel area and the sub-pixel area are different. This not only causes dark lines between the main pixel area and the sub-pixel area, but also causes dark lines in the main pixel area and the sub-pixel area.

Therefore, an array substrate and a display panel are urgently needed to solve the above technical problems.

SUMMARY OF THE INVENTION

The present application provides an array substrate and a display panel to solve technical problems that there are many dark lines in a pixel electrode layer and an aperture ratio is low.

To solve the above technical problems, technical solutions provided in the present application are as follows.

An embodiment of the present application provides an array substrate, comprising a substrate, a thin film transistor layer disposed on the substrate, and a pixel electrode layer disposed on the thin film transistor layer. The pixel electrode layer comprises a plurality of pixel regions. the pixel regions comprise a first pixel region and a second pixel region, a pixel electrode in the first pixel region is insulated from a pixel electrode in the second pixel region, the pixel electrode in the second pixel region is disposed along an outer boundary of the first pixel region, or the pixel electrode in the first pixel region is disposed along an outer boundary of the second pixel region.

In an embodiment of the present application, an area of the first pixel region is less than an area of the second pixel region.

In an embodiment of the present application, the pixel electrode layer further comprises a first trunk electrode and a second trunk electrode arranged vertically. The first trunk electrode and the second trunk electrode distinguish the pixel regions into four liquid crystal alignment regions, and any one of the liquid crystal alignment regions comprises at least one first sub-pixel region and at least one second sub-pixel region. A plurality of first branch electrodes are disposed in any of the first sub-pixel regions, and any of the first branch electrodes is disposed at a first preset angle with the first trunk electrode or the second trunk electrode. A plurality of second branch electrodes are disposed in any of the second sub-pixel regions, and any of the second branch electrodes is disposed at a second preset angle with the first trunk electrode or the second trunk electrode.

In an embodiment of the present application, a boundary corresponding to the first sub-pixel region and the second sub-pixel region in any of the liquid crystal alignment regions is a polyline or a curve.

In an embodiment of the present application, the pixel electrodes in the second pixel region are disposed along an outer boundary of the first pixel region. An orthographic projection of a signal line in the thin film transistor layer on the pixel electrode layer is located between two adjacent pixel regions.

In an embodiment of the present application, the pixel electrodes in the first pixel region are disposed along an outer boundary of the second pixel region. An orthographic projection of a signal line in the thin film transistor layer on the pixel electrode layer is located in the second pixel region.

In an embodiment of the present application, a difference between a voltage of the first sub-pixel region and a voltage of the second sub-pixel region in the liquid crystal alignment region is 2 volts.

In an embodiment of the present application, a voltage of the first sub-pixel region in the liquid crystal alignment region is greater than a voltage of the second sub-pixel region.

In an embodiment of the present application, the first branch electrode and/or the second branch electrode in adjacent two liquid crystal alignment regions is symmetrically arranged with the first trunk electrode or the second trunk electrode as an axis.

In an embodiment of the present application, two of the first branch electrodes in any one of the liquid crystal alignment regions are parallel to each other, and the first preset angle comprises 30°, 45°, and 60°. Two of the second branch electrodes in any one of the liquid crystal alignment regions are parallel to each other, and the second preset angle comprises 30°, 45°, and 60°.

An embodiment of the present application further provides a display panel, comprising an array substrate, a color filter substrate, and a liquid crystal layer located between the color filter substrate and the array substrate. The array substrate comprises a substrate, a thin film transistor layer disposed on the substrate, and a pixel electrode layer disposed on the thin film transistor layer. The pixel electrode layer comprises a plurality of pixel regions. the pixel regions comprise a first pixel region and a second pixel region, a pixel electrode in the first pixel region is insulated from a pixel electrode in the second pixel region, the pixel electrode in the second pixel region is disposed along an outer boundary of the first pixel region, or the pixel electrode in the first pixel region is disposed along an outer boundary of the second pixel region.

In an embodiment of the present application, an area of the first pixel region is less than an area of the second pixel region.

In an embodiment of the present application, the pixel electrode layer further comprises a first trunk electrode and a second trunk electrode arranged vertically. The first trunk electrode and the second trunk electrode distinguish the pixel regions into four liquid crystal alignment regions, and any one of the liquid crystal alignment regions comprises at least one first sub-pixel region and at least one second sub-pixel region. A plurality of first branch electrodes are disposed in any of the first sub-pixel regions, and any of the first branch electrodes is disposed at a first preset angle with the first trunk electrode or the second trunk electrode. A plurality of second branch electrodes are disposed in any of the second sub-pixel regions, and any of the second branch electrodes is disposed at a second preset angle with the first trunk electrode or the second trunk electrode.

In an embodiment of the present application, a boundary corresponding to the first sub-pixel region and the second sub-pixel region in any of the liquid crystal alignment regions is a polyline or a curve.

In an embodiment of the present application, the pixel electrodes in the second pixel region are disposed along an outer boundary of the first pixel region. An orthographic projection of a signal line in the thin film transistor layer on the pixel electrode layer is located between two adjacent pixel regions.

In an embodiment of the present application, the pixel electrodes in the first pixel region are disposed along an outer boundary of the second pixel region. An orthographic projection of a signal line in the thin film transistor layer on the pixel electrode layer is located in the second pixel region.

In an embodiment of the present application, a difference between a voltage of the first sub-pixel region and a voltage of the second sub-pixel region in the liquid crystal alignment region is 2 volts.

In an embodiment of the present application, a voltage of the first sub-pixel region in the liquid crystal alignment region is greater than a voltage of the second sub-pixel region.

In an embodiment of the present application, the first branch electrode and/or the second branch electrode in adjacent two liquid crystal alignment regions is symmetrically arranged with the first trunk electrode or the second trunk electrode as an axis.

In an embodiment of the present application, two of the first branch electrodes in any one of the liquid crystal alignment regions are parallel to each other, and the first preset angle comprises 30°, 45°, and 60°. Two of the second branch electrodes in any one of the liquid crystal alignment regions are parallel to each other, and the second preset angle comprises 30°, 45°, and 60°.

Beneficial effects of the present application are that: in an embodiment of the present application, the first pixel region surrounds the second pixel region, or the second pixel region surrounds the first pixel region, so that there is no pressure difference between two adjacent pixel regions. This reduces gap, increases a pixel aperture ratio, reduces dark lines in the pixel area, and improves visual effects.

BRIEF DESCRIPTION OF THE SEVERAL VIEWS OF THE DRAWINGS

The following detailed description of specific embodiments of the present application will make the technical solutions and other beneficial effects of the present application obvious in conjunction with the accompanying drawings.

DESCRIPTION OF SPECIFIC EMBODIMENTS OF THE INVENTION

Figure 1:
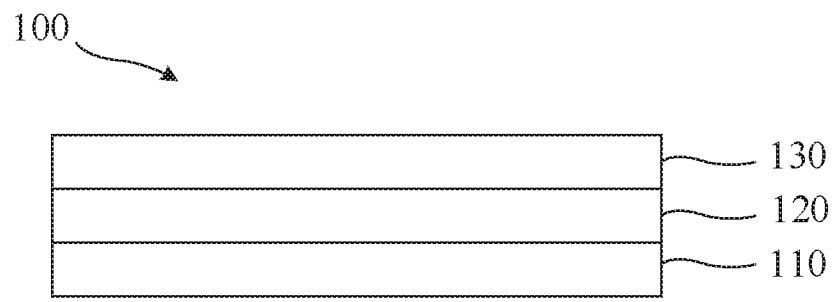
FIG. 1 is a schematic structural diagram of an array substrate provided by the present application.
Figure 2:
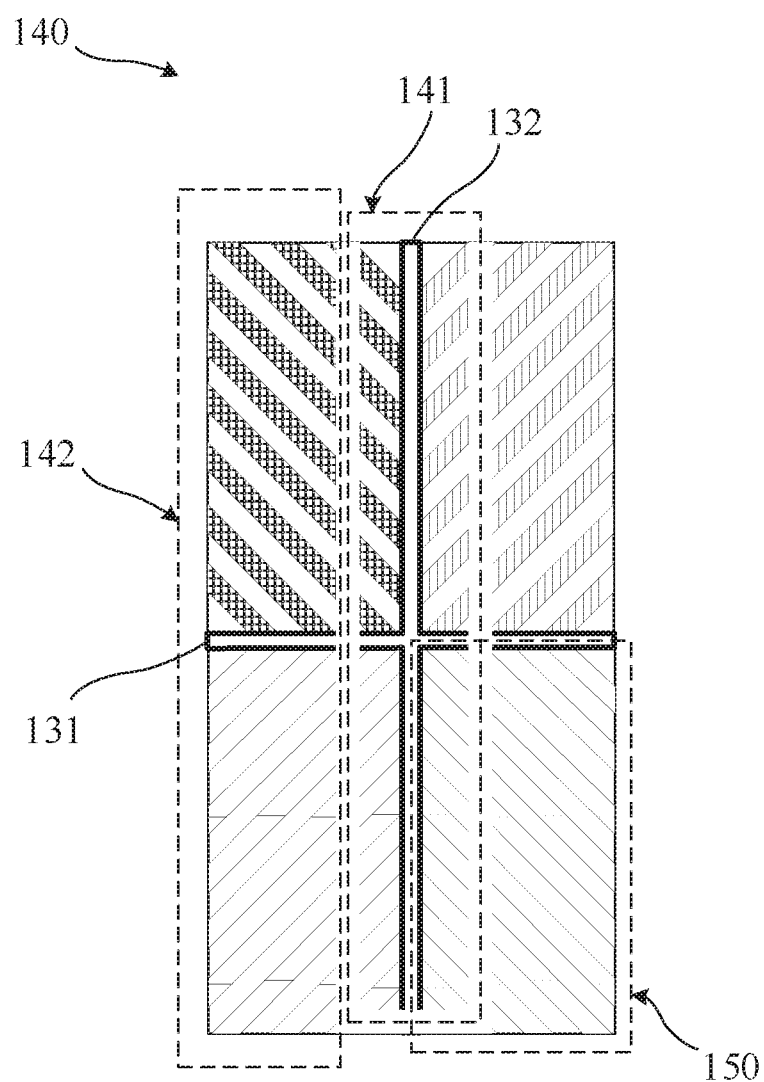
FIG. 2 is a top view of a pixel region of a first structure of an array substrate provided by the present application.
Figure 3:
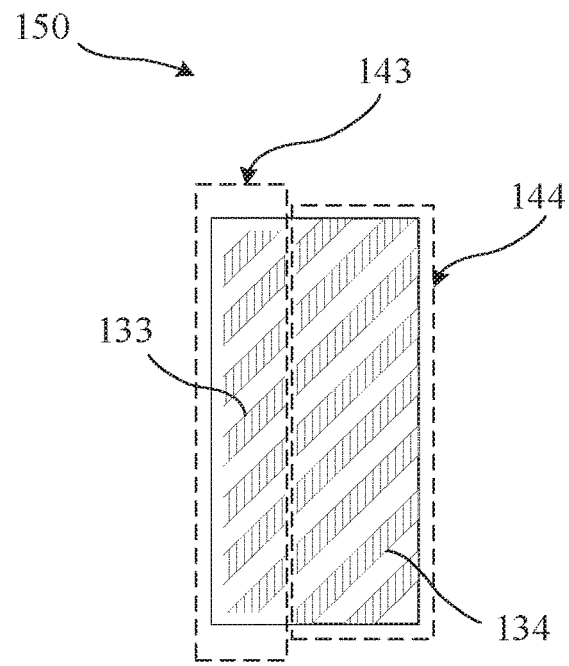
FIG. 3 is a top view of a liquid crystal alignment region of a first structure of an array substrate provided by the present application.
Figure 4:
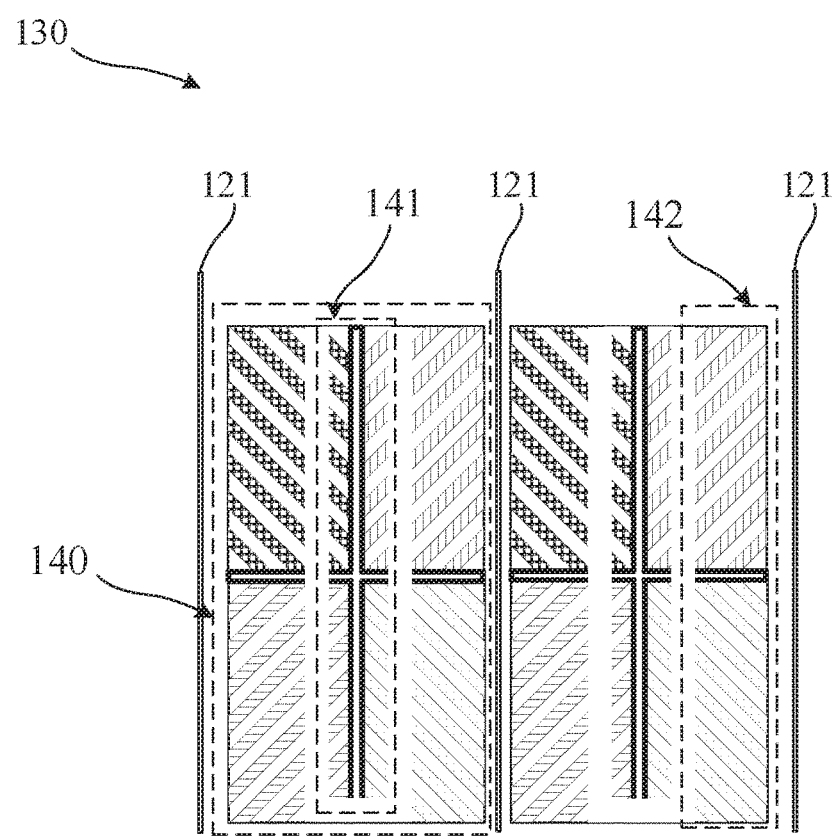
FIG. 4 is a partial top view of a pixel electrode layer of a first structure of an array substrate provided by the present application.
Figure 5:
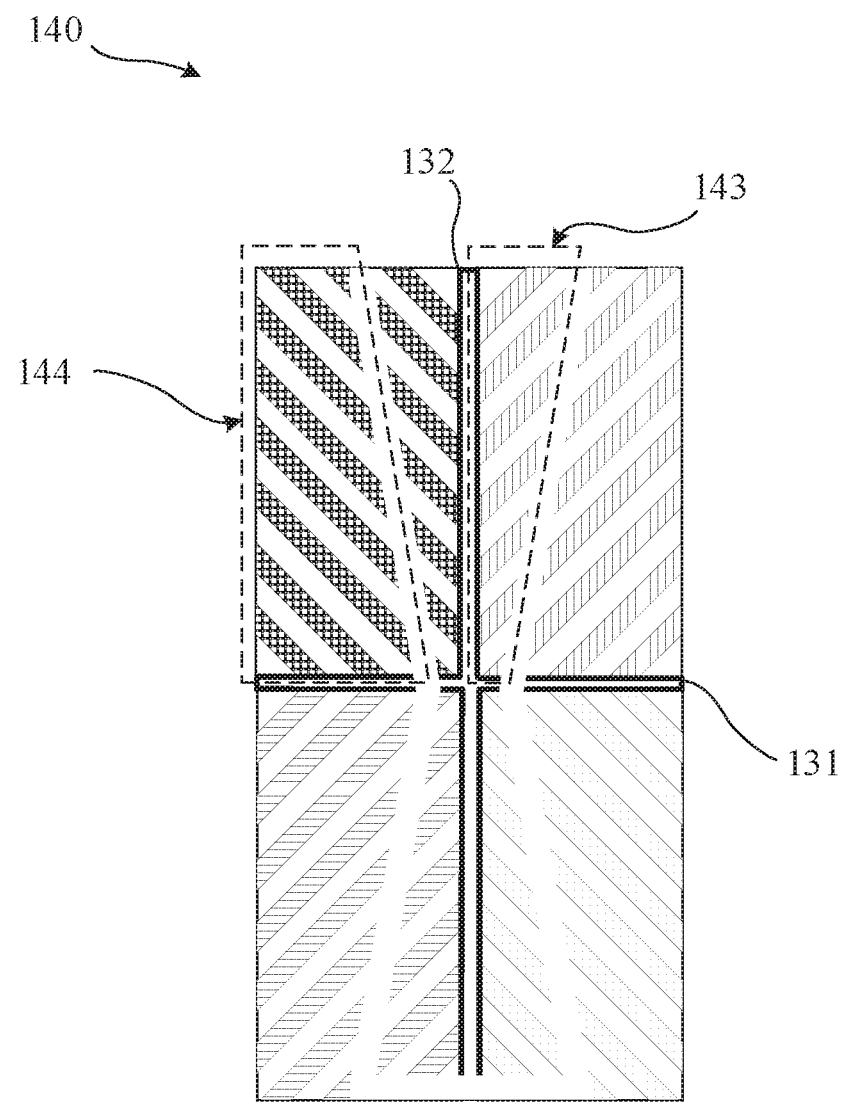
FIG. 5 is a top view of a pixel region of a second structure of an array substrate provided by the present application.
Figure 6:
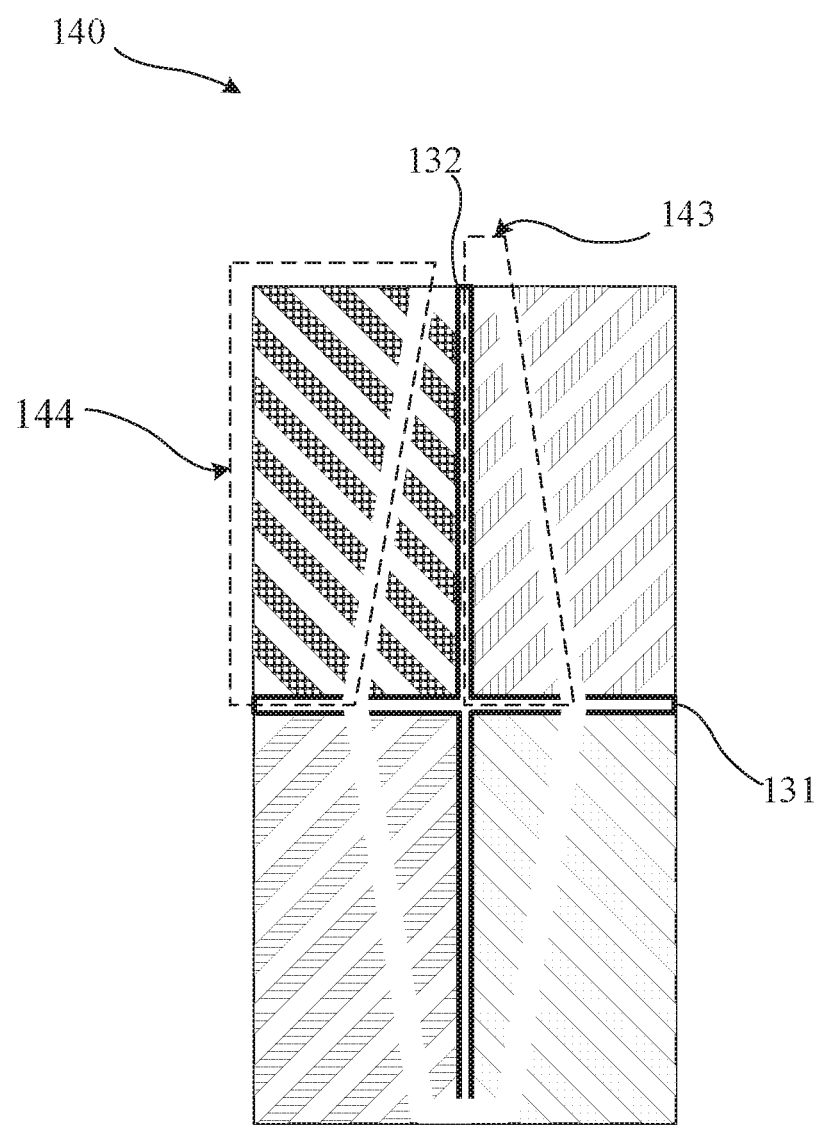
FIG. 6 is a top view of a pixel region of a third structure of an array substrate provided by the present application.
Figure 7:
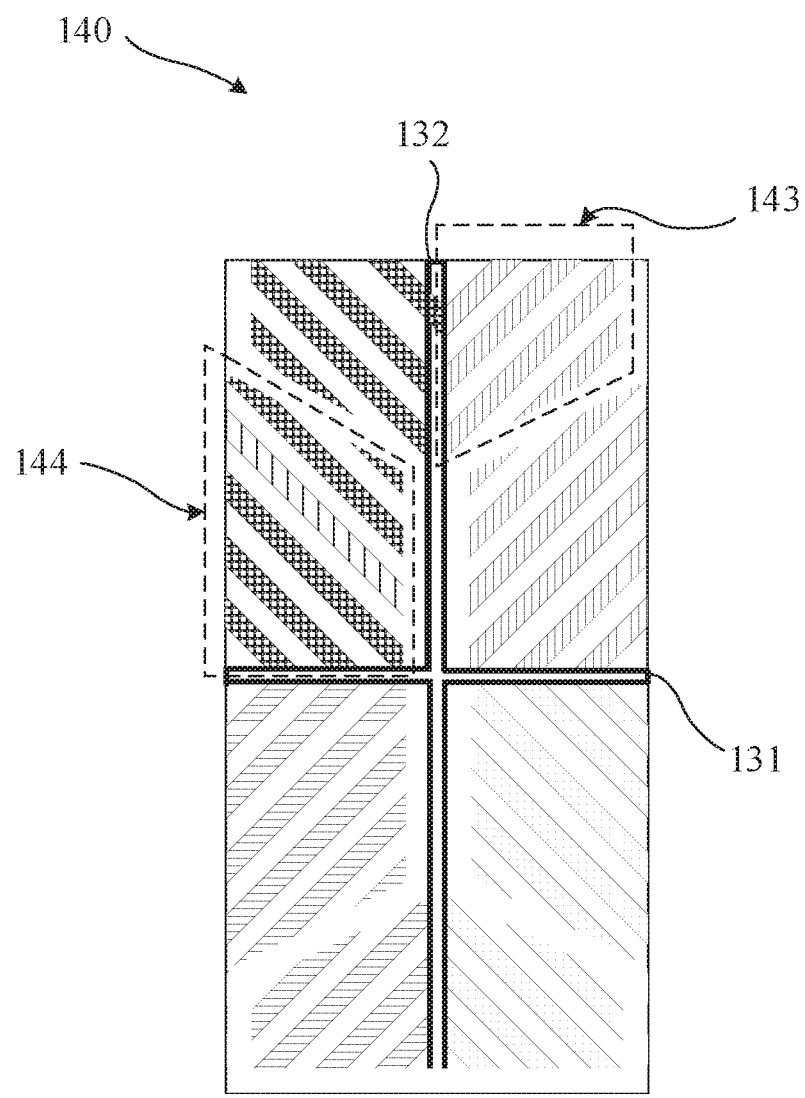
FIG. 7 is a top view of a pixel region of a fourth structure of an array substrate provided by the present application.
Figure 8:
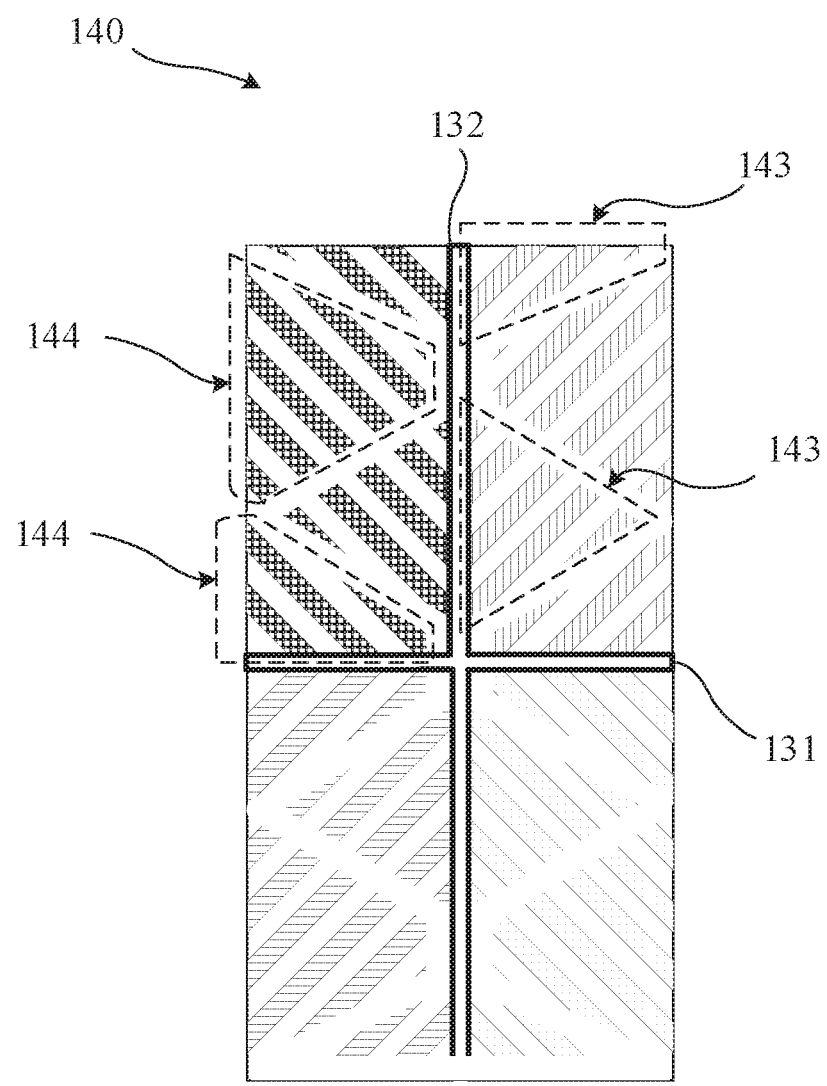
FIG. 8 is a top view of a pixel region of a fifth structure of an array substrate provided by the present application.
Figure 9:
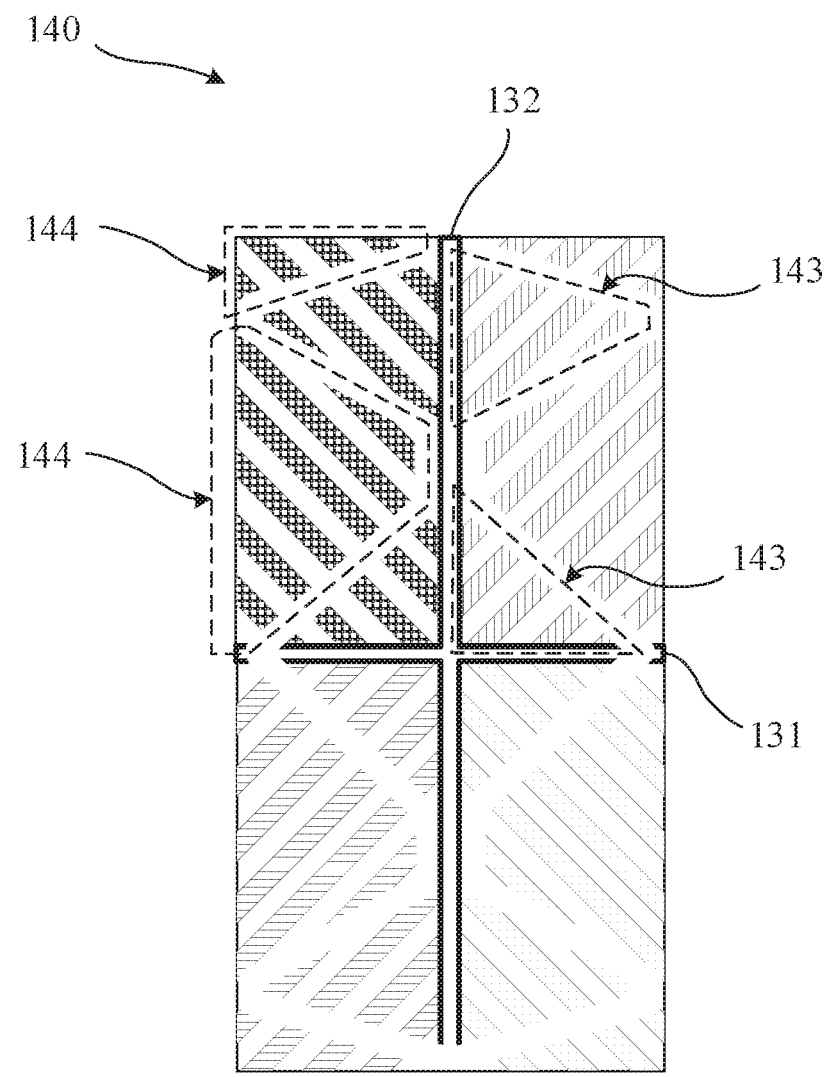
FIG. 9 is a top view of a pixel region of a sixth structure of an array substrate provided by the present application.

The present application provides an array substrate and a display panel. In order to make the purpose, technical solution, and effect of the present application clearer and more definite, the present application is further described in detail below with reference to the accompanying drawings and examples. It is understood that the specific embodiments described herein are only used to explain the present application and are not used to limit the application.

Referring to FIG. 1 to FIG. 10, an embodiment of the present application provides an array substrate 100. The array substrate 100 includes a substrate 110, a thin film transistor layer 120 disposed on the substrate 110, and a pixel electrode layer 130 disposed on the thin film transistor layer 120.

The pixel electrode layer 130 includes a plurality of pixel regions 140. The pixel regions 140 include a first pixel region 141 and a second pixel region 142. A pixel electrode in the first pixel region 141 is insulated from a pixel electrode in the second pixel region 142. The pixel electrode in the second pixel region 142 is disposed along an outer boundary of the first pixel region 141, or the pixel electrode in the first pixel region 141 is disposed along an outer boundary of the second pixel region 142.

In an embodiment of the present application, the first pixel region surrounds the second pixel region, or the second pixel region surrounds the first pixel region, so that there is no pressure difference between two adjacent pixel regions. This reduces gap, increases a pixel aperture ratio, reduces dark lines in the pixel area, and improves visual effects.

A technical solution of the present application is described in combination with specific embodiments.

First Embodiment

Referring to FIG. 1 to FIG. 9, the array substrate 100 includes a substrate 110, a thin film transistor layer 120 disposed on the substrate 110, and a pixel electrode layer 130 disposed on the thin film transistor layer 120.

The pixel electrode layer 130 includes a plurality of pixel regions 140. The pixel regions 140 include a first pixel region 141 and a second pixel region 142. A pixel electrode in the first pixel region 141 is insulated from a pixel electrode in the second pixel region 142. The pixel electrode in the second pixel region 142 is disposed along an outer boundary of the first pixel region 141, or the pixel electrode in the first pixel region 141 is disposed along an outer boundary of the second pixel region 142.

In the embodiment, the first pixel region 141 is a main pixel region, and the second pixel region 142 is a sub-pixel region.

In the embodiment, an area of the first pixel region 141 is less than an area of the second pixel region 142. Please refer to FIG. 2 to FIG. 9 for details. In order to ensure a good viewing angle and light transmittance, to avoid risk of vertical crosstalk, the area of the main pixel area is less than the area of the sub-pixel area. This can better improve the viewing angle, increase the light transmittance, and improve working efficiency of liquid crystal.

In the embodiment, the pixel electrode layer further includes a first trunk electrode 131 and a second trunk electrode 132 which are vertically disposed. The first trunk electrode 131 and the second trunk electrode 132 divide the pixel region 130 into four liquid crystal alignment regions 150. Any of the liquid crystal alignment regions 133 includes at least one first sub-pixel region 143 and at least one second sub-pixel region 144. A plurality of first branch electrodes 133 are disposed in any one of the first sub-pixel regions 143. Any of the first branch electrodes 133 is disposed at a first preset angle with the first trunk electrode 131 or the second trunk electrode 132. Please refer to FIG. 2 and FIG. 3 for details. A plurality of second branch electrodes 134 are disposed in any of the second sub-pixel regions 144, and any of the second branch electrodes 134 is disposed at a second preset angle with the first trunk electrode 131 or the second trunk electrode 132. The main pixel area surrounds the sub-pixel area, or the sub-pixel area surrounds the main pixel area, thereby reducing the dark lines between the main pixel area and the sub-pixel area when the main sub-pixel area is arranged up and down in the prior art.

In the embodiment, the first preset angles of the first branch electrodes of any of the first sub-pixel regions in any of the liquid crystal alignment regions are the same. The second preset angles of the second branch electrodes of any of the second sub-pixel regions in any of the liquid crystal alignment regions are the same. Please refer to FIG. 2 to FIG. 9 for details. That is, alignment of the liquid crystals corresponding to any of the first sub-pixel regions in any of the liquid crystal alignment regions is the same. Alignment of liquid crystals corresponding to any of the second sub-pixel regions in any of the liquid crystal alignment regions is the same. This can better improve liquid crystal efficiency.

In the embodiment, the first trunk electrode 131, the second trunk electrode 132, the first branch electrode 133, and the second branch electrode 134 are in a strip shape. This is beneficial to improve liquid crystal efficiency and facilitate electrode arrangement. Please refer to FIG. 2 to FIG. 9 for details.

In the embodiment, at least one of the liquid crystal alignment regions 150 includes two first sub-pixel regions 143 and two second sub-pixel regions 144. Please refer to FIGS. 8 and 9 for details. The larger the number of the first sub-pixel region and/or the second sub-pixel region in the liquid crystal alignment region, the better the viewing angle is improved, but the liquid crystal efficiency may be reduced. When the number of the first sub-pixel regions and the number of the second sub-pixel regions are two in the liquid crystal alignment region, both the viewing angle and the liquid crystal efficiency can be effectively improved.

In the embodiment, a boundary corresponding to the first sub-pixel region 143 and the second sub-pixel region 144 in any of the liquid crystal alignment regions 150 may be a polyline or a curve. For details, please refer to FIGS. 8 and 9. This increases a contact area between the main pixel area and the sub-pixel area. Transition liquid crystal corresponding to the main pixel region and the sub-pixel region increases diversity of a tilt angle of the liquid crystal and improves the viewing angle.

In the embodiment, the pixel electrodes in the second pixel region 142 are disposed along an outer boundary of the first pixel region 141. An orthographic projection of a signal line 121 in the thin film transistor layer 120 on the pixel electrode layer is located between two adjacent pixel regions 140. Please refer to FIG. 2 to FIG. 9 for details. The signal line 121 may be a data line or a scan line. The main pixel area is affected by the signal line and there is a risk of vertical crosstalk. When the pixel electrode in the second pixel region is arranged along the outer boundary of the first pixel region, the orthographic projection of the signal line on the pixel electrode layer is located between two adjacent pixel regions. Please refer to FIG. 4 for details. A distance between the signal line and the first pixel area is relatively long, and a metal shielding layer between the signal line and the first pixel area in the prior art can be omitted. This reduces capacitance between the main pixel area and the sub-pixel area, improves crosstalk, there is no pressure difference between adjacent two pixel areas, an interval between adjacent two pixel areas is reduced, and a pixel aperture ratio is increased.

In the embodiment, a difference between a voltage of the first sub-pixel region and a voltage of the second sub-pixel region in the liquid crystal alignment region is 2 volts. Under combined effect of a pressure difference between upper and lower electrode plates in the array substrate and a pressure difference between the main pixel area and the sub-pixel area, diversity of a tilt angle of the liquid crystal can be increased in a middle and low gray levels, and a viewing angle can be effectively improved. At high gray levels, it can effectively reduce dark lines and improve liquid crystal efficiency.

In the embodiment, the voltage of the first sub-pixel region 143 in the liquid crystal alignment region 150 is greater than the voltage of the second sub-pixel region 144. The voltage of the main pixel region is greater than the voltage of the sub-pixel region. Under the combined effect of the pressure difference between the upper and lower electrode plates in the array substrate and the pressure difference between the main pixel area and the sub-pixel area, the diversity of the tilt angle of the liquid crystal can be increased in the middle and low gray levels, and the viewing angle can be effectively improved. At high gray levels, it can effectively reduce dark lines and improve liquid crystal efficiency.

In the embodiment, a voltage of the first sub-pixel region 143 in the liquid crystal alignment region 150 is smaller than a voltage of the second sub-pixel region 144. The voltage of the main pixel region is smaller than the voltage of the sub-pixel region. Under the combined effect of the pressure difference between the upper and lower electrode plates in the array substrate and the pressure difference between the main pixel area and the sub-pixel area, the diversity of the tilt angle of the liquid crystal can be increased in the middle and low gray levels, and the viewing angle can be effectively improved. At high gray levels, it can effectively reduce dark lines and improve liquid crystal efficiency.

In the embodiment, the first branch electrode 133 and/or the second branch electrode 134 in adjacent two liquid crystal alignment regions 150 is symmetrically arranged with the first trunk electrode 131 or the second trunk electrode 132 as an axis. Please refer to FIG. 2 to FIG. 9 for details. The pixel electrodes in the pixel area are symmetrical about the trunk electrode, which improves symmetry of a viewing angle and effectively improves the viewing angle.

In the embodiment, two of the first branch electrodes 133 in any one of the liquid crystal alignment regions 150 are parallel to each other, and the first preset angle comprises 30°, 45°, and 60°. Two of the second branch electrodes 134 in any one of the liquid crystal alignment regions 150 are parallel to each other, and the second preset angle comprises 30°, 45°, and 60°. The branch electrodes in the same sub-pixel area are parallel to each other, which is beneficial to the electrode arrangement and improves the liquid crystal efficiency. Limiting the first preset angle and the second preset angle is beneficial to the electrode arrangement and improves the liquid crystal efficiency.

In the first embodiment of the present application, the pixel electrodes in the second pixel region are arranged along the outer boundary of the first pixel region, and the transition liquid crystal corresponding to the main pixel region and the sub-pixel region can effectively improve the viewing angle. The orthographic projection of the signal line 121 on the pixel electrode layer located in the thin film transistor layer 120 is located between two adjacent pixel areas 140, and the influence of vertical crosstalk between the main pixel area and the data line is reduced. This makes there is no pressure difference between two adjacent pixels, reduces the gap, increases the pixel aperture ratio, reduces dark lines, improves the light transmission rate, improves the viewing angle, and enhances the user experience.

Second Embodiment

Figure 10:
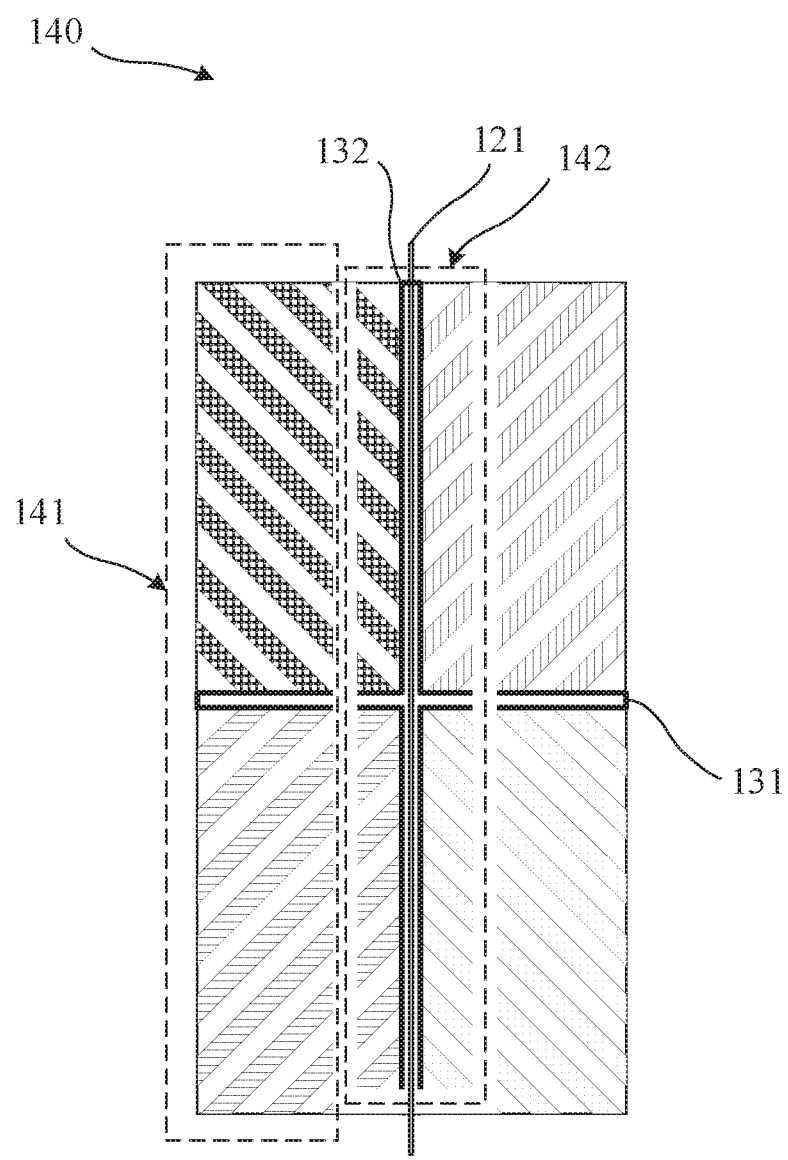
FIG. 10 is a top view of a pixel region of a seventh structure of an array substrate provided by the present application.

Referring to FIG. 10, this embodiment is the same as or similar to the first embodiment, except that:

Pixel electrodes in the first pixel region 141 are disposed along an outer boundary of the second pixel region 142.

In this embodiment, the pixel electrodes in the first pixel region 141 are disposed along an outer boundary of the second pixel region 142. The orthographic projection of the signal line 121 located in the thin film transistor layer 120 on the pixel electrode layer 130 is located in the second pixel region 142. Please refer to FIG. 10 for details. The signal line 121 may be a data line or a scan line. The main pixel area is affected by the signal lines and there is a risk of vertical crosstalk. When a pixel electrode in the first pixel region is disposed along an outer boundary of the second pixel region, an orthographic projection of a signal line located in the thin film transistor layer on the pixel electrode layer is located in the second pixel region. The signal line is set away from the main pixel area, and there is no pressure difference between adjacent two pixel areas. The interval between two adjacent pixel regions is reduced, while increasing the pixel aperture ratio, the capacitance between the main pixel region and the data line is reduced, and crosstalk is improved.

In the second embodiment of the present application, the pixel electrodes in the first pixel region 141 are arranged along the outer boundary of the second pixel region 142, and the transition liquid crystal corresponding to the main pixel region and the sub-pixel region can effectively improve the viewing angle. The orthographic projection of the signal line 121 in the thin film transistor layer 120 on the pixel electrode layer 130 is located in the second pixel region 142, and the influence of vertical crosstalk between the main pixel region and the data line is reduced. This makes there is no pressure difference between two adjacent pixels, reduces the gap, increases the pixel aperture ratio, reduces dark lines, improves the light transmission rate, improves the viewing angle, and enhances the user experience.

The present application also provides a display panel. The display includes the array substrate 100, a color filter substrate, and a liquid crystal layer located between the color filter substrate and the array substrate according to any one of the embodiments of the present application. For the specific structure, refer to the embodiment in the first embodiment, and details are not described herein again.

The present application discloses an array substrate and a display panel. The array substrate includes a substrate, a thin film transistor layer disposed on the substrate, and a pixel electrode layer disposed on the thin film transistor layer. The pixel electrode layer includes a plurality of pixel regions. The pixel regions include a first pixel region and a second pixel region. The pixel electrode in the first pixel region is insulated from the pixel electrode in the second pixel region. The pixel electrodes in the second pixel region are disposed along the outer boundary of the first pixel region, or the pixel electrodes in the first pixel region are disposed along the outer boundary of the second pixel region. In the present application, the first pixel region surrounds the second pixel region or the second pixel region surrounds the first pixel region, so that there is no pressure difference between adjacent two pixel regions, a gap is reduced, and a pixel aperture ratio is increased, thereby reducing dark lines in the pixel region and improving visual effect.

In summary, the present application discloses an array substrate and a display panel. The array substrate includes a substrate, a thin film transistor layer disposed on the substrate, and a pixel electrode layer disposed on the thin film transistor layer. The pixel electrode layer includes a plurality of pixel regions. The pixel regions include a first pixel region and a second pixel region. The pixel electrode in the first pixel region is insulated from the pixel electrode in the second pixel region. The pixel electrodes in the second pixel region are disposed along the outer boundary of the first pixel region, or the pixel electrodes in the first pixel region are disposed along the outer boundary of the second pixel region. In the present application, the first pixel region surrounds the second pixel region or the second pixel region surrounds the first pixel region, so that there is no pressure difference between adjacent two pixel regions, a gap is reduced, and a pixel aperture ratio is increased, thereby reducing dark lines in the pixel region and improving visual effect.

It can be understood that, for a person of ordinary skill in the art, equivalent replacements or changes may be made according to the technical solution and the inventive concept of the present application. All these changes or replacements should fall within the protection scope of the claims attached to the present application.

What is claimed is:

1. An array substrate, comprising:
  a substrate, a thin film transistor layer disposed on the substrate, and a pixel electrode layer disposed on the thin film transistor layer;
  wherein the pixel electrode layer comprises a plurality of pixel regions, the pixel regions comprise a first pixel region and a second pixel region, a pixel electrode in the first pixel region is insulated from a pixel electrode in the second pixel region, the pixel electrode in the second pixel region is disposed along an outer boundary of the first pixel region, or the pixel electrode in the first pixel region is disposed along an outer boundary of the second pixel region;

wherein the first pixel region is a main pixel region, and the second pixel region is a sub-pixel region, an area of the main pixel region is less than an area of the sub-pixel region;

wherein an alignment of liquid crystal corresponding to any of the first sub-pixel regions in any of liquid crystal alignment regions is same, and an alignment of liquid crystal corresponding to any of the second sub-pixel regions in any of the liquid crystal alignment regions is same.

2. The array substrate according to claim 1, wherein the pixel electrode layer further comprises:

a first trunk electrode and a second trunk electrode arranged vertically;

wherein the first trunk electrode and the second trunk electrode distinguish the pixel regions into four liquid crystal alignment regions, and any one of the liquid crystal alignment regions comprises at least one first sub-pixel region and at least one second sub-pixel region;

wherein a plurality of first branch electrodes are disposed in any of the first sub-pixel regions, and any of the first branch electrodes is disposed at a first preset angle with the first trunk electrode or the second trunk electrode;

wherein a plurality of second branch electrodes are disposed in any of the second sub-pixel regions, and any of the second branch electrodes is disposed at a second preset angle with the first trunk electrode or the second trunk electrode.

3. The array substrate according to claim 2, wherein a boundary corresponding to the first sub-pixel region and the second sub-pixel region in any of the liquid crystal alignment regions is a polyline or a curve.

4. The array substrate according to claim 2, wherein the pixel electrodes in the second pixel region are disposed along an outer boundary of the first pixel region;

wherein an orthographic projection of a signal line in the thin film transistor layer on the pixel electrode layer is located between two adjacent pixel regions.

5. The array substrate according to claim 2, wherein the pixel electrodes in the first pixel region are disposed along an outer boundary of the second pixel region;

wherein an orthographic projection of a signal line in the thin film transistor layer on the pixel electrode layer is located in the second pixel region.

6. The array substrate according to claim 2, wherein a difference between a voltage of the first sub-pixel region and a voltage of the second sub-pixel region in the liquid crystal alignment region is 2 volts.

7. The array substrate according to claim 2, wherein a voltage of the first sub-pixel region in the liquid crystal alignment region is greater than a voltage of the second sub-pixel region.

8. The array substrate according to claim 2, wherein the first branch electrode and/or the second branch electrode in adjacent two liquid crystal alignment regions is symmetrically arranged with the first trunk electrode or the second trunk electrode as an axis.

9. The array substrate according to claim 2, wherein two of the first branch electrodes in any one of the liquid crystal alignment regions are parallel to each other, and the first preset angle comprises 30°, 45°, and 60°;

wherein two of the second branch electrodes in any one of the liquid crystal alignment regions are parallel to each other, and the second preset angle comprises 30°, 45°, and 60°.

10. A display panel, comprising:

an array substrate, a color filter substrate, and a liquid crystal layer located between the color filter substrate and the array substrate;

wherein the array substrate comprises a substrate, a thin film transistor layer disposed on the substrate, and a pixel electrode layer disposed on the thin film transistor layer;

wherein the pixel electrode layer comprises a plurality of pixel regions, the pixel regions comprise a first pixel region and a second pixel region, a pixel electrode in the first pixel region is insulated from a pixel electrode in the second pixel region, the pixel electrode in the second pixel region is disposed along an outer boundary of the first pixel region, or the pixel electrode in the first pixel region is disposed along an outer boundary of the second pixel region;

wherein the first pixel region is a main pixel region, and the second pixel region is a sub-pixel region, an area of the main pixel region is less than an area of the sub-pixel region;

wherein an alignment of liquid crystal corresponding to any of the first sub-pixel regions in any of liquid crystal alignment regions is same, and an alignment of liquid crystal corresponding to any of the second sub-pixel regions in any of the liquid crystal alignment regions is same.

11. The display panel according to claim 10, wherein the pixel electrode layer further comprises:

a first trunk electrode and a second trunk electrode arranged vertically;

wherein the first trunk electrode and the second trunk electrode distinguish the pixel regions into four liquid crystal alignment regions, and any one of the liquid crystal alignment regions comprises at least one first sub-pixel region and at least one second sub-pixel region;

wherein a plurality of first branch electrodes are disposed in any of the first sub-pixel regions, and any of the first branch electrodes is disposed at a first preset angle with the first trunk electrode or the second trunk electrode;

wherein a plurality of second branch electrodes are disposed in any of the second sub-pixel regions, and any of the second branch electrodes is disposed at a second preset angle with the first trunk electrode or the second trunk electrode.

12. The display panel according to claim 11, wherein a boundary corresponding to the first sub-pixel region and the second sub-pixel region in any of the liquid crystal alignment regions is a polyline or a curve.

13. The display panel according to claim 11, wherein the pixel electrodes in the second pixel region are disposed along an outer boundary of the first pixel region;

wherein an orthographic projection of a signal line in the thin film transistor layer on the pixel electrode layer is located between two adjacent pixel regions.

14. The display panel according to claim 11, wherein the pixel electrodes in the first pixel region are disposed along an outer boundary of the second pixel region;

wherein an orthographic projection of a signal line in the thin film transistor layer on the pixel electrode layer is located in the second pixel region.

15. The display panel according to claim 11, wherein a difference between a voltage of the first sub-pixel region and a voltage of the second sub-pixel region in the liquid crystal alignment region is 2 volts.

16. The display panel according to claim 11, wherein a voltage of the first sub-pixel region in the liquid crystal alignment region is greater than a voltage of the second sub-pixel region.

17. The display panel according to claim 11, wherein the first branch electrode and/or the second branch electrode in adjacent two liquid crystal alignment regions is symmetrically arranged with the first trunk electrode or the second trunk electrode as an axis.

18. The display panel according to claim 11, wherein two of the first branch electrodes in any one of the liquid crystal alignment regions are parallel to each other, and the first preset angle comprises 30°, 45°, and 60°;

wherein two of the second branch electrodes in any one of the liquid crystal alignment regions are parallel to each other, and the second preset angle comprises 30°, 45°, and 60°.

\* \* \* \* \*

UNITED STATES PATENT AND TRADEMARK OFFICE
CERTIFICATE OF CORRECTION

PATENT NO. : 11,314,132 B2
APPLICATION NO. : 16/627337
DATED : April 26, 2022
INVENTOR(S) : Kaili Qu et al.

Page 1 of 1

It is certified that error appears in the above-identified patent and that said Letters Patent is hereby corrected as shown below:

On the Title Page

Item (73) Assignee:
"TCL China Star Optoelectrenics Technology Co., Ltd."
Should be changed to:
-- TCL China Star Optoelectronics Technology Co., Ltd. --

Signed and Sealed this
Twenty-ninth Day of November, 2022

Katherine Kelly Vidal
*Director of the United States Patent and Trademark Office*